(12) United States Patent
Takayama et al.

(10) Patent No.: US 11,152,695 B2
(45) Date of Patent: Oct. 19, 2021

(54) ANTENNA MODULE

(71) Applicant: Murata Manufacturing Co., Ltd., Kyoto (JP)

(72) Inventors: Keisei Takayama, Kyoto (JP); Kaoru Sudo, Kyoto (JP); Shigeru Tago, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/993,378

(22) Filed: Aug. 14, 2020

(65) Prior Publication Data

US 2020/0373655 A1 Nov. 26, 2020

Related U.S. Application Data

(63) Continuation of application No. PCT/JP2019/030417, filed on Aug. 2, 2019.

(30) Foreign Application Priority Data

Aug. 7, 2018 (JP) .............................. JP2018-148428

(51) Int. Cl.
*H01Q 1/40* (2006.01)
*H01Q 1/38* (2006.01)
(Continued)

(52) U.S. Cl.
CPC ................. *H01Q 1/40* (2013.01); *H01Q 1/38* (2013.01); *H05K 1/0243* (2013.01); *H05K 3/46* (2013.01); *H05K 2201/10098* (2013.01)

(58) Field of Classification Search
CPC ........ H01Q 1/2283; H01Q 1/243; H01Q 1/38; H01Q 1/40; H01Q 9/0407; H05K 1/0243
See application file for complete search history.

(56) References Cited

U.S. PATENT DOCUMENTS 9,531,062 B2 * 12/2016 Park ....................... H01Q 5/371
10,270,186 B2 * 4/2019 Teshima ................... H01Q 3/24
(Continued)

FOREIGN PATENT DOCUMENTS

CN 203950929 U 11/2014
JP H08335827 A 12/1996
(Continued)

OTHER PUBLICATIONS

International Search Report for Application No. PCT/JP2019/030417, dated Oct. 1, 2019.
(Continued)

*Primary Examiner* — Minh N Trinh
(74) *Attorney, Agent, or Firm* — Pearne & Gordon LLP

(57) ABSTRACT

An antenna module includes: a dielectric substrate including a multilayer structure, the dielectric substrate having a first surface and a second surface, the second surface being opposite the first surface; an antenna pattern formed on the first surface side of the dielectric substrate; a RFIC provided on the second surface of the dielectric substrate, the RFIC supplying a radio frequency signal to the antenna pattern; and a power supply line that supplies power to the RFIC, wherein the thickness of the power supply line in the stacking direction (Z axis direction) of the dielectric substrate is thicker than the thickness of the antenna pattern in the stacking direction.

19 Claims, 9 Drawing Sheets

(51) Int. Cl.
*H05K 1/02* (2006.01)
*H05K 3/46* (2006.01)

(56) References Cited

U.S. PATENT DOCUMENTS

| | | | |
|---|---|---|---|
| 2003/0103006 | A1 | 6/2003 | Yamada |
| 2013/0009320 | A1 | 1/2013 | Yoo et al. |
| 2013/0076570 | A1 | 3/2013 | Lee et al. |
| 2013/0181874 | A1 | 7/2013 | Park et al. |
| 2015/0042530 | A1 | 2/2015 | Kitano et al. |
| 2015/0200445 | A1 | 7/2015 | Murphy |
| 2017/0062953 | A1* | 3/2017 | Teshima .................. H01Q 3/24 |
| 2017/0222316 | A1 | 8/2017 | Mizunuma et al. |
| 2020/0373655 | A1* | 11/2020 | Takayama ............ H01Q 1/2283 |

FOREIGN PATENT DOCUMENTS

| | | | |
|---|---|---|---|
| JP | 2003-179427 A | 6/2003 | |
| JP | 2003-258511 A | 9/2003 | |
| JP | 2003-332830 A | 11/2003 | |
| JP | 2005-12554 A | 1/2005 | |
| JP | 2013-146064 A | 7/2013 | |
| KR | 10-2013-0005811 A | 1/2013 | |
| KR | 10-2013-0032979 A | 4/2013 | |
| WO | 2016/063759 A1 | 4/2016 | |

OTHER PUBLICATIONS

Written Opinion for Application No. PCT/JP2019/030417, dated Oct. 1, 2019.

* cited by examiner

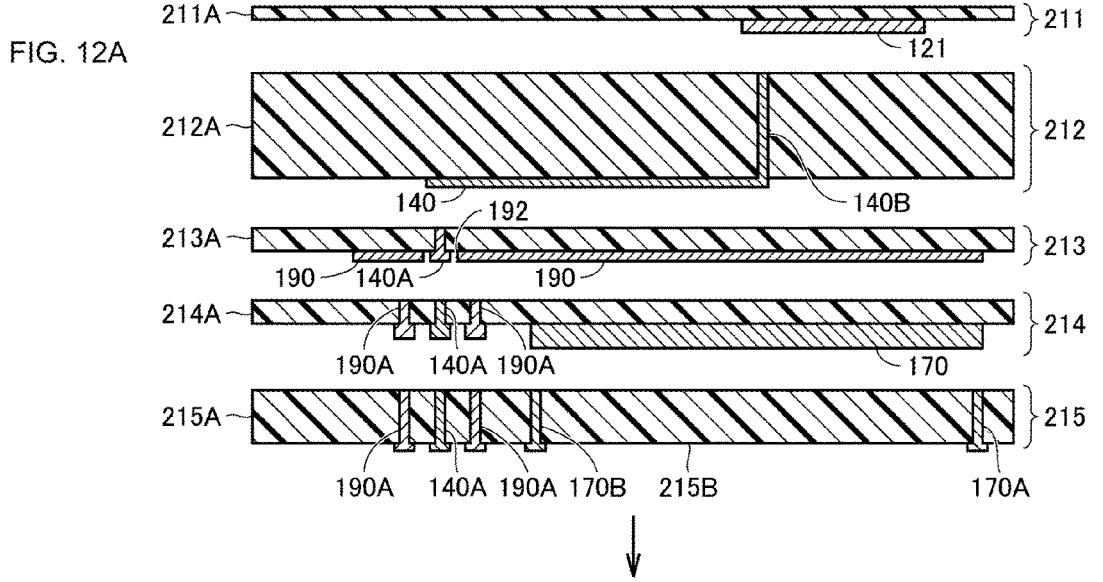
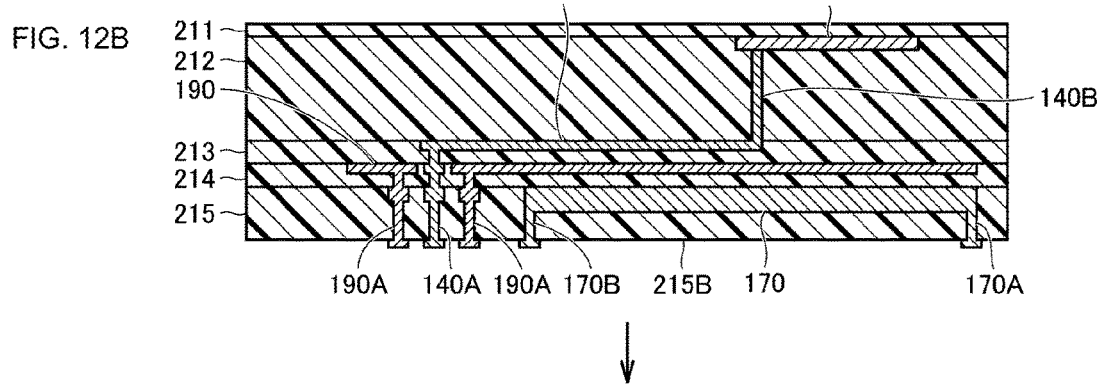
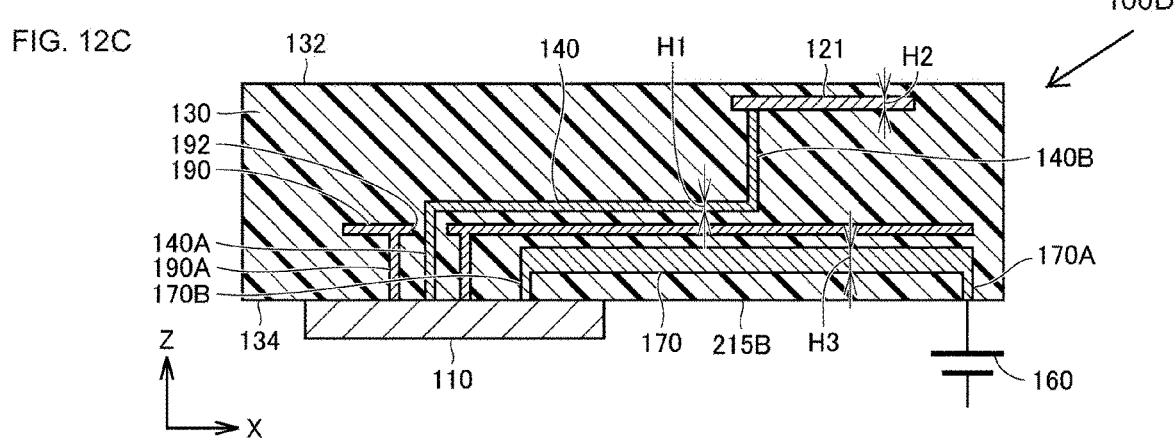

ANTENNA MODULE

This is a continuation of International Application No. PCT/JP2019/030417 filed on Aug. 2, 2019 which claims priority from Japanese Patent Application No. 2018-148428 filed on Aug. 7, 2018. The contents of these applications are incorporated herein by reference in their entireties.

BACKGROUND

Technical Field

The present disclosure relates to antenna modules and fabrication methods for antenna modules, and more specifically to technologies that improve flexibility in designing antenna modules.

Until now, there are proposed antenna modules in each of which an antenna pattern is placed on a first surface of a dielectric substrate and a radio frequency element is mounted on a second surface opposite the first surface. The radio frequency element supplies a radio frequency signal to the antenna pattern (for example, patent document 1).

Patent Document 1: International Publication No. 2016/063759 pamphlet

BRIEF SUMMARY

In the antenna module described in the patent document 1, a power supply line, through which power for driving the radio frequency element is transmitted, needs to transmit larger power compared to other lines. In view of this point, it is conceivable to reduce the resistance value of the power supply line in order to reduce transmission loss of power in the power supply line. To reduce the resistance value of the power supply line, it is conceivable to shorten the length of the power supply line or widen the width of the power supply line. However, when the length of the power supply line is shortened or the width of the power supply line is widened, there is an issue of limiting the flexibility in designing the antenna module as a whole.

The present disclosure improves the flexibility in designing an antenna module on which an antenna pattern and a radio frequency circuit are mounted.

An antenna module according to a certain aspect of the present disclosure includes: a dielectric substrate including a multilayer structure, the dielectric substrate having a first surface and a second surface, the second surface being opposite the first surface; an antenna pattern formed on the first surface side of the dielectric substrate; a radio frequency circuit provided on the second surface side of the dielectric substrate, the radio frequency circuit supplying a radio frequency signal to the antenna pattern; and a power supply line that supplies power to the radio frequency circuit, wherein thickness of the power supply line in a stacking direction of the dielectric substrate is thicker than thickness of the antenna pattern in the stacking direction.

A fabrication method for an antenna module according to another aspect of the present disclosure includes: a step of stacking a plurality of joined layers, each joined layer being formed by joining a metal layer and a dielectric layer; a step of forming a dielectric substrate by pressure-bonding the plurality of joined layers stacked in the step of stacking; and a step of mounting a radio frequency circuit on the dielectric substrate, wherein the plurality of joined layers includes a first layer on which an antenna pattern is formed, the antenna pattern receiving a radio frequency signal from the radio frequency circuit, a second layer on which a power supply line that supplies power to the radio frequency circuit is formed, and a third layer on which a ground conductor is formed, the step of stacking includes a step of stacking the plurality of joined layers in such a way that the metal layers of the plurality of joined layers are all facing a side on which the radio frequency circuit is mounted, and thickness of the power supply line in a stacking direction is thicker than thickness of the antenna pattern in the stacking direction.

The present disclosure enables to improve the flexibility in designing an antenna module on which an antenna pattern and a radio frequency circuit are mounted.

BRIEF DESCRIPTION OF THE SEVERAL VIEWS OF THE DRAWINGS

FIGS. 12A, 12B, and 12C are diagrams illustrating a fabrication method of an antenna module according to the fourth embodiment.

DETAILED DESCRIPTION

Figure 1:
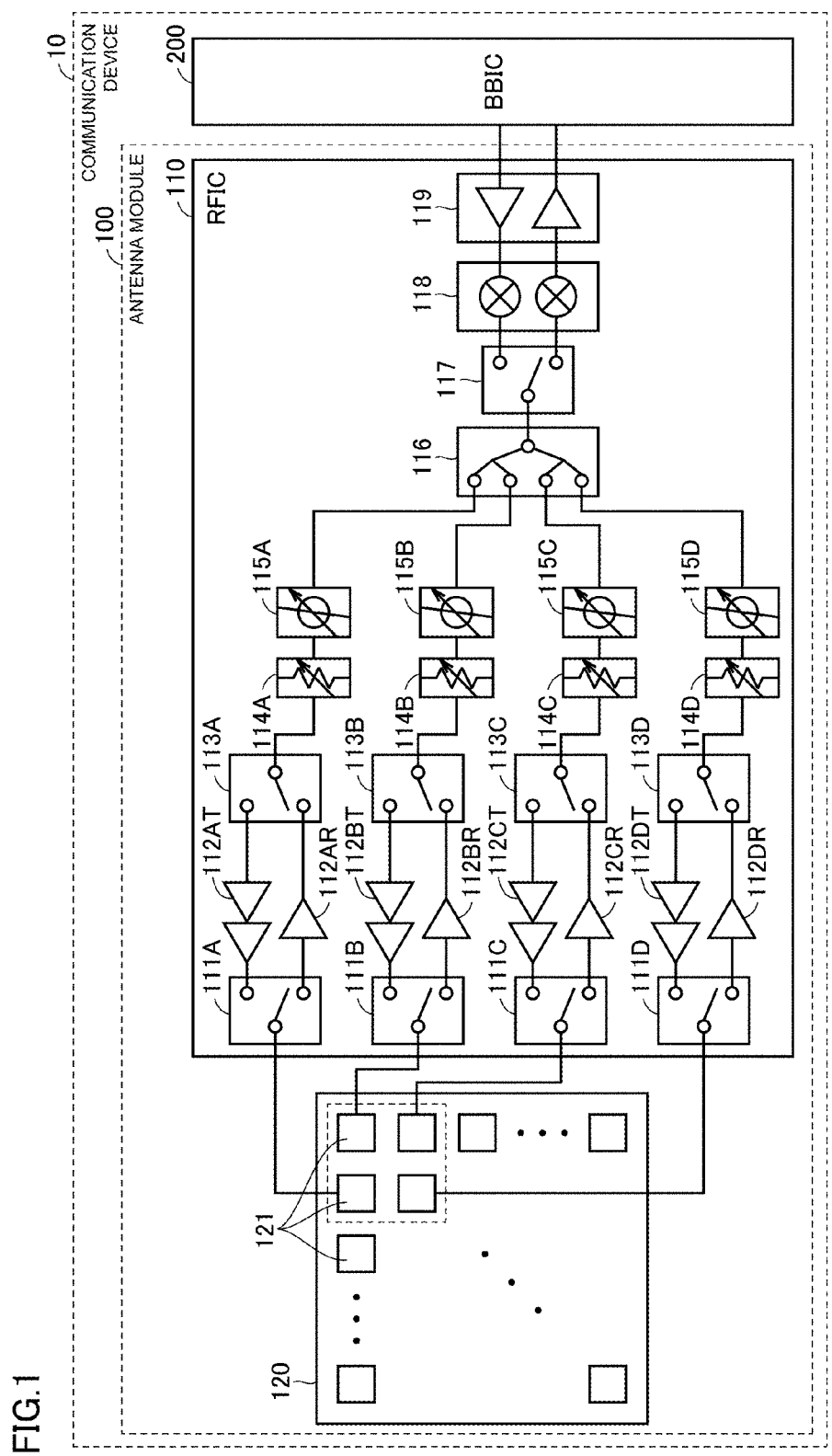
FIG. 1 is a block diagram of a communication device to which an antenna module according to a first embodiment is applied.

Hereinafter, embodiments of the present disclosure will be described in detail with reference to the drawings. Note that the same reference numerals are assigned to the same or corresponding portions in the drawings, and description thereof will not be repeated.

First Embodiment (Basic Configuration of Communication Device)

FIG. 1 is a block diagram of one example of a communication device 10 to which an antenna module 100 according to the present first embodiment is applied. The communication device 10 may be, for example, a mobile phone, a mobile terminal such as a smartphone, a tablet, or the like, or a personal computer with a communication function.

Referring to FIG. 1, the communication device 10 includes an antenna module 100 and a BBIC 200 that constitutes a base-band signal processing circuit. The antenna module 100 includes a RFIC 110 that is one example of a radio frequency circuit and an antenna array 120. The communication device 10 up-converts a signal sent from the BBIC 200 to the antenna module 100 into a radio frequency signal and radiates from the antenna array 120, and also down-converts a radio frequency signal received by the antenna array 120 and processes a signal at the BBIC 200.

Note that in FIG. 1, for ease of description, of a plurality of antenna patterns 121 forming the antenna array 120, only a configuration corresponding to four antenna patterns 121 is illustrated, and configurations corresponding to other antenna patterns 121 having a similar configuration are omitted. Further, in the present embodiment, a case where the antenna pattern 121 is a patch antenna having a rectangular plate shape is described as an example.

The RFIC 110 includes switches 111A to 111D, 113A to 113D, and 117, power amplifier 112AT to 112DT, low noise amplifiers 112AR to 112DR, attenuators 114A to 114D, phase shifters 115A to 115D, a signal multiplexer/demultiplexer 116, a mixer 118, and an amplifier circuit 119.

In the case where a radio frequency signal is transmitted, the switches 111A to 111D and the switches 113A to 113D are switched to power amplifiers 112AT to 112DT sides, and the switch 117 is connected to a transmitting side amplifier of the amplifier circuit 119. in the case where a radio frequency signal is received, the switches 111A to 111D and the switches 113A to 113D are switched to low noise amplifiers 112AR to 112DR sides, and the switch 117 is connected to a receiving side amplifier of the amplifier circuit 119.

A signal sent from the BBIC 200 is amplified at the amplifier circuit 119 and up-converted at the mixer 118. A transmitting signal that is an up-converted radio frequency signal is split into four signals at the signal multiplexer/demultiplexer 116 and respectively fed to different antenna patterns 121 after passing through four signal paths. At this time, the directivity of the antenna array 120 can be adjusted by individually adjusting the degrees of phase shift of the phase shifters 115A to 115D placed in respective signal paths.

Received signals that are radio frequency signals received by the respective antenna patterns 121 are sent via the four different signal paths and multiplexed at the signal multiplexer/demultiplexer 116. A multiplexed received signal is down-converted at the mixer 118, amplified at the amplifier circuit 119, and sent to the BBIC 200.

The RFIC 110 is formed as, for example, a one-chip integrated circuit component including the foregoing circuit configuration. Alternatively, devices (switches, power amplifiers, low noise amplifiers, attenuators, and phase shifters) corresponding to each antenna pattern 121 in the RFIC 110 may be formed as a one-chip integrated circuit component for each antenna pattern 121.

In the example of FIG. 1, the antenna patterns 121 are arranged two-dimensionally. Alternatively, the antenna patterns 121 may be arranged one-dimensionally (that is, may be arranged linearly). Alternatively, a single antenna pattern may be included.

(Structure of Antenna Module)

Figure 2:
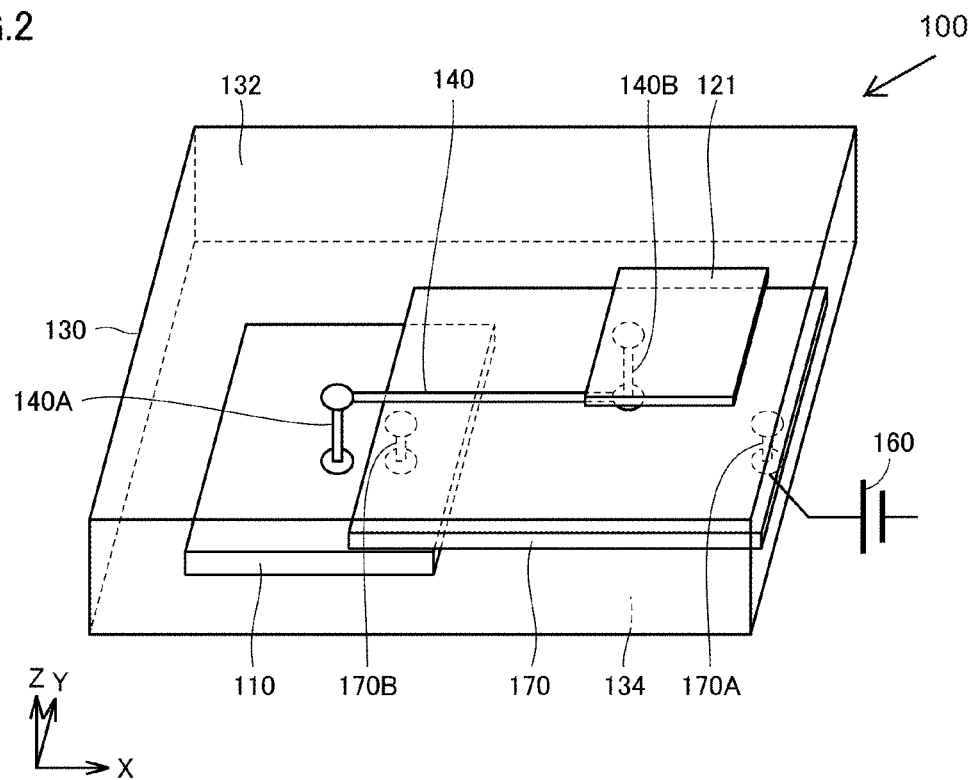
FIG. 2 is a perspective view of an antenna module according to the first embodiment.

FIG. 2 is a transparent perspective view of the antenna module 100 according to the first embodiment. Referring to FIG. 2, the antenna module 100 includes a dielectric substrate 130 and a power supply line 170 in addition to the antenna patterns 121 and the RFIC 110. Further, the RFIC 110 receives power from a power supply circuit 160. Note that, for simplification of the drawings, unless otherwise described, the power supply circuit 160 is denoted by a DC symbol. The power supply circuit 160 may be formed of a circuit or may be, for example, a power supply module formed of two or more circuits. Accordingly, the power supply circuit 160 may be referred to as a power supply unit (power providing unit). In the illustration of the antenna module 100 in FIG. 2 and like, for ease of description, only one antenna pattern 121 is illustrated, and the other antenna patterns 121 are not illustrated.

The dielectric substrate 130 has a multilayer structure. Typically, the dielectric substrate 130 is, for example, a substrate formed to have a multilayer structure composed of resin such as epoxy, polyimide, or the like. Further, the dielectric substrate 130 may alternatively be composed of liquid crystal polymer (LCP) having a lower dielectric constant or fluorine resin.

The dielectric substrate 130 has a first surface 132 and a second surface 134 opposite the first surface 132. The antenna pattern 121 is placed on the first surface 132 of the dielectric substrate 130 or a layer inside the dielectric substrate 130. That is to say, the antenna pattern 121 is placed on the first surface 132 side of the dielectric substrate 130.

The RFIC 110 is mounted on the second surface 134 (mounting surface) of the dielectric substrate 130 with connection electrodes such as solder bumps (not illustrated) or the like interposed therebetween.

In FIG. 2, the Z axis is the axis along a stacking direction in the multilayer structure of the dielectric substrate 130. Further, axes orthogonal to the Z axis are the X axis and the Y axis. In the following, the length in the X axis direction may be referred to as "length", the length in the Y axis direction may be referred to as "width", and the length in the Z axis direction may be referred to as "thickness", in some cases. Further, in some cases, the positive direction of the Z axis direction may be referred to as "Z axis positive direction", and the negative direction of the Z axis direction may be referred to as "Z axis negative direction". The example of FIG. 2 has the configuration in which the antenna pattern 121 is buried in the dielectric substrate 130 in such a way that the first surface 132 of the dielectric substrate 130 and the surface of the antenna pattern 121 are at the same level in the Z axis direction.

Figure 3:
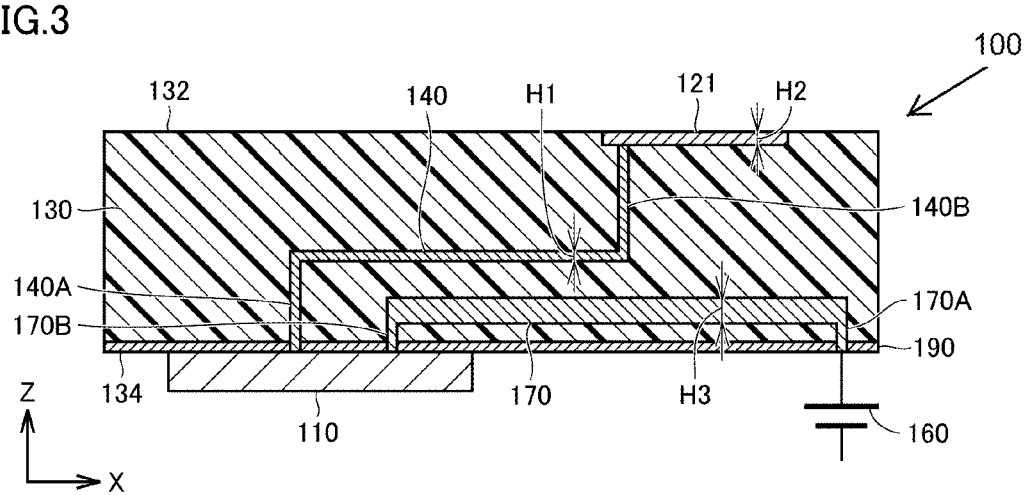
FIG. 3 is a cross-sectional view of an antenna module according to the first embodiment.

FIG. 3 is a cross-sectional view of the antenna module 100 in the X-Z plane. The antenna pattern 121 and the power supply line 170 are provided in the dielectric substrate 130 having a multilayer structure. Note that in FIG. 3, the example in which one antenna pattern 121 is placed on the first surface 132 is illustrated. In practice, however, all the antenna patterns 121 included in the antenna array 120 may be arranged on the first surface 132.

The power supply line 170 is electrically connected to the power supply circuit 160 by way of a via 170A. The power supply line 170 is electrically connected to the RFIC 110 by way of a via 170B.

The power supply line 170 extends in a direction (X axis direction and Y axis direction) orthogonal to the stacking direction (Z axis direction) of the multilayer structure of the dielectric substrate 130 (see FIG. 2). In other words, the power supply line 170 extends in the direction toward the RFIC 110 from the power supply circuit 160. The via 170A and the via 170B extend in the stacking direction (Z axis direction) of the multilayer structure of the dielectric substrate 130.

Power from the power supply circuit 160 is transmitted to the via 170A, the power supply line 170, the via 170B, and the RFIC 110 in this order. In other words, the power supply line 170 supplies power from the power supply circuit 160 to the RFIC 110.

A signal line 140 is electrically connected to the RFIC 110 by way of a via 140A. The signal line 140 is electrically connected to the antenna pattern 121 by way of a via 140B.

The signal line 140 extends in a direction (for example, X axis direction) orthogonal to the stacking direction (Z axis direction) of the multilayer structure of the dielectric substrate 130. The via 140A and the via 140B extend in the stacking direction (Z axis direction) of the multilayer structure of the dielectric substrate 130.

A radio frequency signal from the RFIC 110 is transmitted to the via 140A, the signal line 140, the via 140B, and the antenna pattern 121 in this order. That is to say, the signal line 140 supplies a radio frequency signal supplied from the RFIC 110 to the antenna pattern 121. Further, the signal line 140 supplies a radio frequency signal received by the antenna pattern 121 to the RFIC 110.

A ground conductor 190 is placed inside the dielectric substrate 130 between the power supply line 170 and the second surface 134. The ground conductor 190 is provided with openings through which the via 140A, the via 170A, and the via 170B are formed. Note that in FIG. 2, the ground conductor 190 is not illustrated.

In the antenna module having such configuration, generally, it is necessary to transmit larger power in the power supply line 170 through which power for driving the RFIC 110 is transmitted, compared to other lines. Thus, from the point of view of power efficiency, it is desirable to reduce the transmission loss of power in the power supply line.

Further, the voltage value supplied from the power supply circuit 160 and the voltage value required by the RFIC 110 are determined in advance. Thus, it is necessary for the power supply line 170 supplying power from the power supply circuit 160 to the RFIC 110 to keep the amount of voltage drop within a predetermined range. A designer of the antenna module 100 needs to design the resistance value of the power supply line 170, that is, the dimensions of the power supply line 170 in such a manner as to reduce the transmission loss in the power supply line 170 and keep the amount of voltage drop within the predetermined range.

In the following, "H1" is the thickness of the signal line 140, "H2" is the thickness of the antenna pattern 121, and "H3" is the thickness of the power supply line 170.

In the present embodiment, the antenna pattern 121, the signal line 140, and the power supply line 170 are configured in such a way that the thickness H3>the thickness H2>the thickness H1. That is to say, the thickness H3 of the power supply line 170 in the stacking direction (Z axis direction) of the dielectric substrate 130 is thicker than the thickness H2 of the antenna pattern 121 in the stacking direction. The thickness H1 of the signal line 140 in the stacking direction is thinner than the thickness H3 of the power supply line 170 in the stacking direction. The thickness H1 of the signal line 140 in the stacking direction is thinner than the thickness H2 of the antenna pattern 121 in the stacking direction. As a modification example, H2=H1 may be used. For example, the thickness H3 of the power supply line 170 is 12 μm, the thickness H2 of the antenna pattern 121 is 6 μm, and the thickness H1 of the signal line 140 is 6 μm.

A material of the power supply line 170 is, typically, a metal such as copper or the like. The relationship between the resistance value R of the power supply line 170 and the thickness H3 of the power supply line 170 is expressed by the following equation (A):

$$R=(\rho \times L)/(W \times H3) \quad (A)$$

where ρ of the equation (A) is the resistivity specific to the power supply line 170, W of the equation (A) is the length of the power supply line 170 in the Y axis direction, that is, the width of the power supply line 170, and L of the equation (A) is the length of the power supply line 170 in the X axis direction.

As illustrated in the equation (A), the resistance value R of the power supply line 170 is inversely proportional to the thickness H3 of the power supply line 170. Accordingly, as the thickness H3 of the power supply line 170 increases, the resistance value R of the power supply line 170 decreases.

According to the equation (A), to reduce the resistance value of the power supply line 170, it is conceivable to widen the width W (length in the Y axis direction) of the power supply line 170 or shorten the length L (length in the X axis direction) of the power supply line 170.

However, the minimum length of the length L of the power supply line is determined by relative positions of the RFIC 110 and the power supply circuit 160, and thus shortening the length of the power supply line to a desired length has a limitation. Further, when a linear arrangement is employed to shorten the length L of the power supply line, the arrangement of other members in the antenna module is limited from the point of view of prevention of the physical interference or electromagnetic coupling between these members and the power supply line 170.

On the other hand, when the width (length in the Y axis direction) of the power supply line 170 is widened, the area of the power supply line 170 increases as a result in the plan view of the first surface 132 of the antenna module 100 from the Z axis direction. As a result, the arrangement of other members in the antenna module is limited from the point of view of prevention of physical interference or electromagnetic coupling between these members and the power supply line 170.

Thus, if the length L of the power supply line 170 were tried to be shortened or the width W of the power supply line 170 were tried to be widened, the flexibility in designing the antenna module 100 as a whole would be limited.

Accordingly, in view of the flexibility in designing the antenna module 100 as a whole, the present embodiment employs techniques that reduce the resistance value of the power supply line 170 by thickening the thickness H3 of the power supply line 170. According to the equation (A), in the case where the length L of the power supply line 170 is the same, the width of the power supply line 170 can be cut in ½ by doubling the thickness of the power supply line 170, for example. This reduces the area of the power supply line 170 to ½ in the plan view of the first surface 132 of the antenna module 100 from the Z axis direction. Accordingly, the physical interference and the electromagnetic coupling between the other members arranged in the antenna module 100 and the power supply line 170 can be suppressed. Further, the resistance value of the power supply line 170 can be adjusted by adjusting the thickness of the power supply line 170, and thus the amount of voltage drop in the power supply line 170 can be kept within a predetermined range. Accordingly, the antenna module 100 of the present embodiment enables to improve the flexibility in design.

Figure 4A:
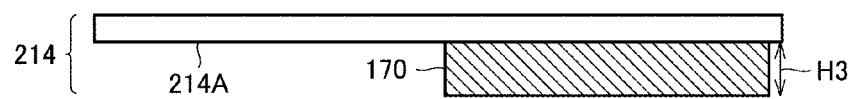
FIGS. 4A, 4B, and 4C are diagrams illustrating various configurations of a power supply line.
Figure 4B:
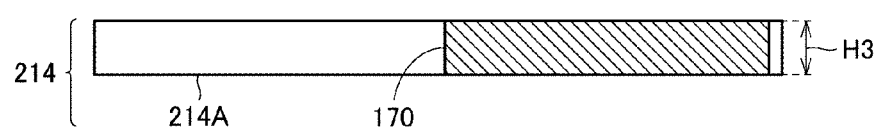
Figure 4C:
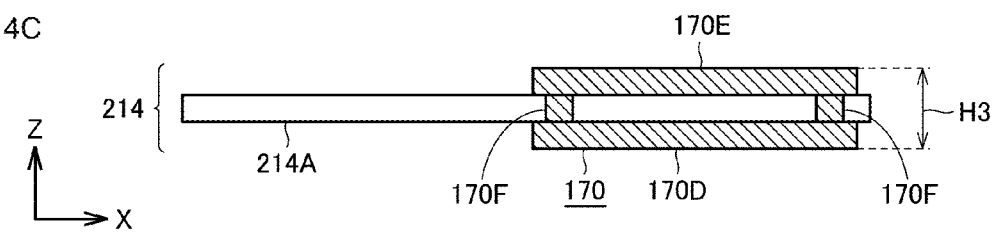

FIGS. 4A, 4B, and 4C are diagrams illustrating one example of a cross-sectional view of the power supply line 170. The power supply line 170 is configured by applying at least one of the following FIG. 4A to FIG. 4C. Note that the antenna module of the present embodiment is formed of a plurality of joined layers (see, for example, FIGS. 12A, 12B, and 12C). The plurality of joined layers includes a power supply line layer 214. The power supply line layer 214 includes a dielectric layer 214A and a power supply line 170 (metal layer) formed by etching.

FIG. 4A is a diagram illustrating the power supply line 170 having a thickness of H3 provided on the dielectric layer 214A.

FIG. 4B is a diagram illustrating the power supply line 170 provided inside the dielectric layer 214A having a thickness of H3.

In FIG. 4C, a metal part 170D and a metal part 170E are respectively provided on both sides of the dielectric layer 214A. Each of the metal part 170D and the metal part 170E are electrically connected to each other by vias 170F that are provided inside the dielectric layer 214A. The power supply line 170 of FIG. 4C includes the metal part 170D, the metal part 170E and the vias 170F. This increases the number of parallel paths in the transmission line and enables to reduce the resistance value compared to a single layer the metal part having the same thickness.

Further, although the thickness of the power supply line 170 is thickened, thickening the thicknesses of the signal line 140 and the antenna pattern 121 from the point of view of dimensional accuracy of the signal line 140 and the antenna pattern 121 is optional, as described below.

For example, the antenna module 100 can achieve a desired antenna characteristic by setting the length of the antenna pattern 121 in the X axis direction to ½ of the wavelength λ0 of a radio frequency signal output from the antenna module 100. If the dimensional accuracy of the antenna pattern 121 were poor, the antenna module 100 could not achieve a desired antenna characteristic (desired frequency bandwidth).

Further, for example, the width of the signal line 140 in the Y axis direction is designed in such a way that the characteristic impedance of the signal line 140 is equal to a desired impedance (for example, 50Ω). If the dimensional accuracy of the signal line 140 is poor, the characteristic impedance of the signal line 140 may not be able to set at a desired impedance.

Figure 5A:
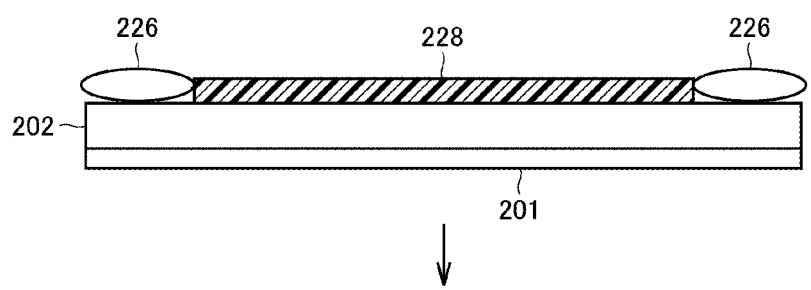
FIGS. 5A and 5B are diagrams illustrating a tapered surface formed on a metal layer.
Figure 5B:
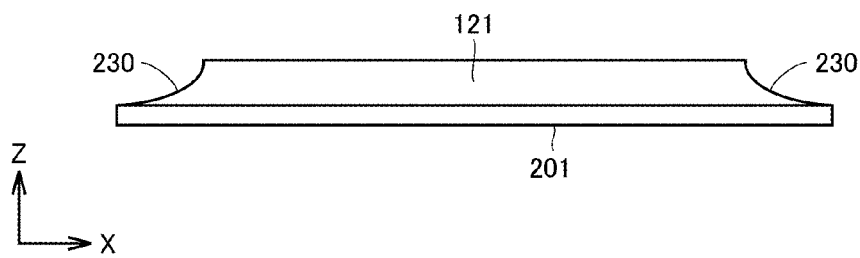

FIGS. 5A, 5B and FIGS. 6A and 6B are diagrams for illustrating improvement of the dimensional accuracy when the thicknesses of the antenna pattern 121 and the signal line 140 are thin. First, it is illustrated that the dimensional accuracy is improved when the thickness of the antenna pattern 121 is thin. FIGS. 5A and 5B illustrate a case where the antenna pattern 121 is produced by etching.

As illustrated in FIG. 5A, a joined layer is used in which a dielectric layer 201 and a metal layer 202 are joined. The metal layer 202 is, for example, composed of copper. It is assumed that the length (length in the X axis direction) of the antenna pattern 121 is the length X1 when fabricated. In order to form the antenna pattern 121 having the length X1 from the metal layer 202, for example, a resist 228 is applied for the length of X1, and part without necessarily the resist 228 is dissolved by a solvent 226.

In the case where the solvent 226 is used to dissolve the metal layer 202, in some cases, both end portions of the metal layer 202 are not completely dissolved due to surface tension of the solvent 226 or the like. Accordingly, in this case, in the case where the resist 228 is removed, as illustrated in FIG. 5B, tapered surfaces 230 are formed on the both sides of the antenna pattern 121.

Figure 6A:
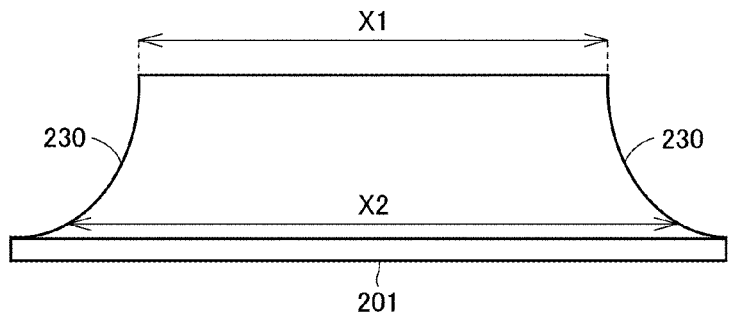
FIGS. 6A and 6B are diagrams for illustrating thickness of a metal layer.

FIG. 6A is a diagram illustrating a case where the thickness of the antenna pattern 121 is thick. As illustrated in FIG. 6A, in the case where the thickness of the antenna pattern 121 is thick, the length of the antenna pattern 121 on the dielectric layer 201 side is a length X2. In the example of FIG. 6A, the difference between the length X1 that is the expected length of the antenna pattern 121 and the length X2 that is the length of the antenna pattern 121 on the dielectric layer 201 side becomes greater. That is to say, in the example of FIG. 6A, the error of the antenna pattern 121 in the X axis direction becomes greater.

Figure 6B:
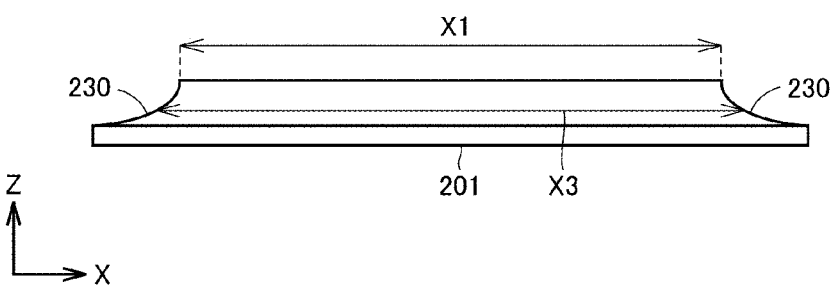

FIG. 6B is a diagram illustrating a case where the thickness of the antenna pattern 121 is thin. As illustrated in FIG. 6B, in the case where the thickness of the antenna pattern 121 is thin, the length of the antenna pattern 121 on the dielectric layer 201 side is a length X3. In the example of FIG. 6B, the difference between the length X1 that is the expected length of the antenna pattern 121 and the length X3 that is the length of the antenna pattern 121 on the dielectric layer 201 side becomes smaller compared to FIG. 6A. That is to say, in the example of FIG. 6B, the error of the antenna pattern 121 in the X axis direction can be made smaller.

In order to have the desired antenna characteristic in the antenna module 100, the length of the antenna pattern 121 can be X1 (for example, λ/2) across the thickness direction. However, in the example of FIG. 6A, the error of the antenna pattern 121 in the X axis direction becomes greater, and thus it is difficult to have a desired antenna characteristic in the antenna module 100. On the other hand, in the example of FIG. 6B, the error of the antenna pattern 121 in the X axis direction can be made smaller, and this facilitates the achievement of a desired antenna characteristic in the antenna module 100.

As described above, the thinner the thickness of the antenna pattern 121 is, the smaller the error of the antenna pattern 121 in the X axis direction becomes, and this enables to improve the dimensional accuracy of the antenna pattern 121.

In order to reduce the transmission loss due to impedance mismatching, generally, the signal line 140 is designed in such a way that the characteristic impedance of the signal line 140 is equal to a desired impedance (for example, 50Ω). The characteristic impedance of the signal line 140 is determined by dimensions of the signal line 140, and thus a high dimensional accuracy is required for the signal line 140 as in the case with the antenna pattern 121. Thus, as described in FIGS. 5A and 5B and FIGS. 6A and 6B, it is also desirable to make the thickness of the signal line 140 thin in order to secure the dimensional accuracy in the signal line 140.

In particular, as illustrated in FIG. 2 and the like, generally, the width (width in the Y axis direction) of the signal line 140 is narrower than the width of the antenna pattern 121. Further, in the fabrication process of the antenna module 100, it is more difficult to secure the dimensional accuracy for a smaller dimension. Accordingly, for the signal line 140 whose width is narrower than that of the antenna pattern 121, a higher dimensional accuracy is needed than the antenna pattern 121 for setting the characteristic impedance to a desired impedance.

In view of the above, the antenna module 100 of the present embodiment is formed in such a way that the thickness H1 of the signal line 140 is thinner than the thickness H2 of the antenna pattern 121. This enables to keep the dimensional accuracy of the signal line 140 and set the characteristic impedance of the signal line 140 to the desired impedance, and as a result, the transmission loss of a radio frequency signal in the signal line 140 can be suppressed.

Further, FIGS. 6A and 6B illustrate a case where the antenna pattern 121 or the signal line 140 is formed by etching. However, even in the case where at least one of the antenna pattern 121 and the signal line 140 is formed by performing different processing, the dimensional accuracy of the antenna pattern 121 and the signal line 140 can be further improved as the thicknesses of the antenna pattern 121 and the signal line 140 become thinner. The different processing is, for example, formation processing that uses plating.

Second Embodiment

Next, an antenna module 100B of the second embodiment is described. In the antenna module 100B of the second embodiment, the ground conductor 190 is provided between the power supply line 170 and the antenna pattern 121 in order to suppress the coupling between the power supply line 170 and the antenna pattern 121. Further, in the antenna module 100B of the second embodiment, the ground conductor 190 is provided between the power supply line 170 and the signal line 140 in order to suppress the coupling between the power supply line 170 and the signal line 140.

Figure 7:
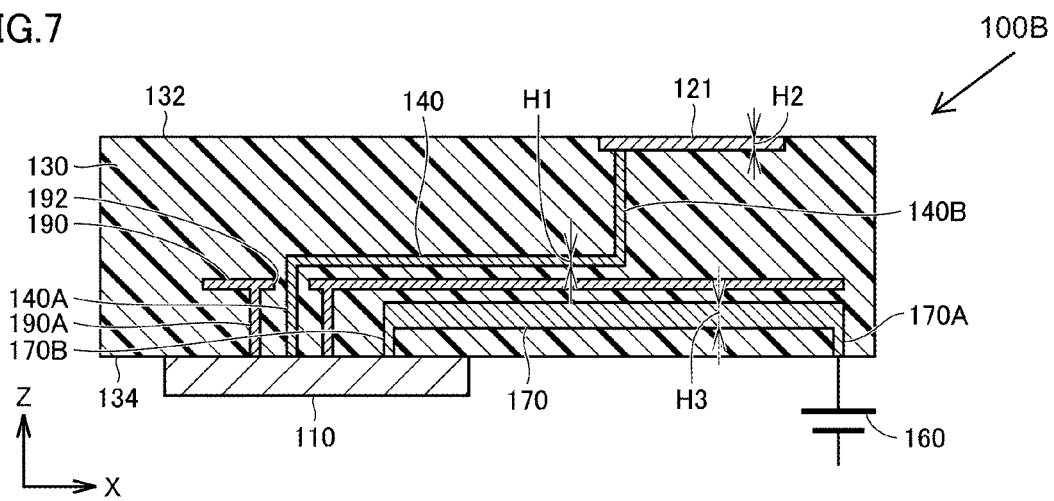
FIG. 7 is a cross-sectional view of an antenna module according to a second embodiment.

FIG. 7 is a cross-sectional view of the antenna module 100B. As illustrated in FIG. 7, the ground conductor 190 is connected to the RFIC 110 by way of a via 190A. Note that the RFIC 110 is provided with a ground line (not particularly illustrated) connected to a ground point provided on an external mounting substrate. That is to say, the ground conductor 190 is connected to the ground point via the RFIC 110. Further, the ground conductor 190 is provided with an opening 192, and the via 140A passes through the opening 192.

Figure 8:
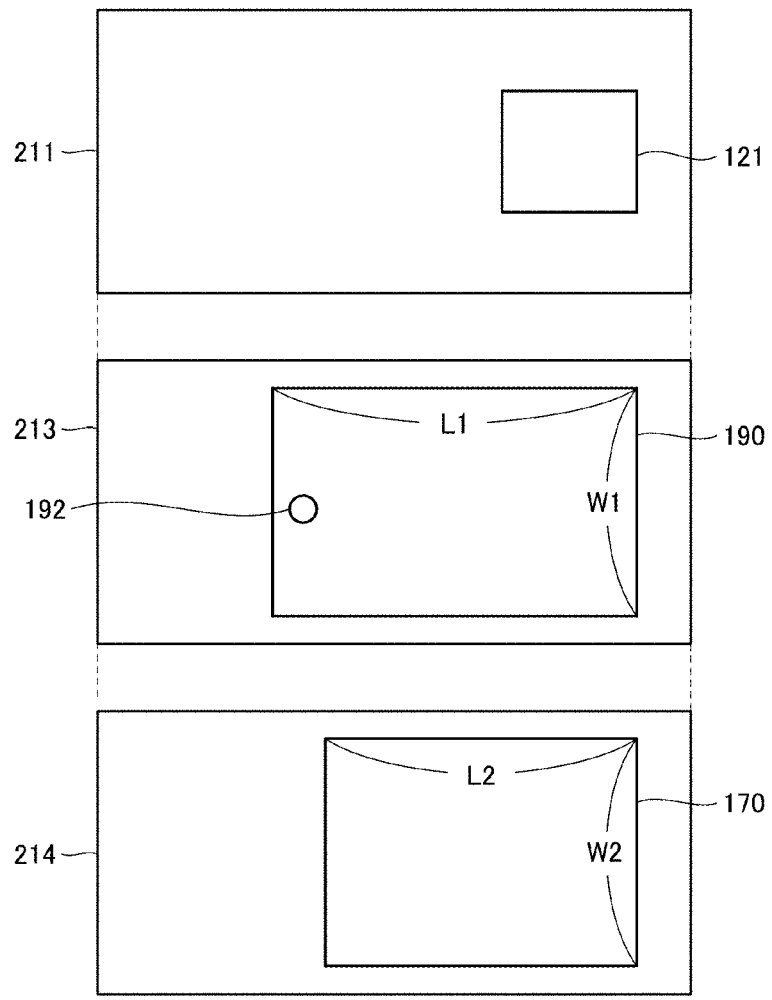
FIG. 8 is a plan view of a decomposed antenna module according to the second embodiment.

FIG. 8 is plan views of respective layers of the antenna module 100B viewed from the Z axis direction of the first surface 132 of the antenna module 100B. The layers of the antenna module 100B include an antenna pattern layer 211 including the antenna pattern 121, a ground conductor layer 213 including the ground conductor 190, a power supply line layer 214 including the power supply line 170, and the RFIC 110.

In the example of FIG. 8, the length L1 (length in the X axis direction) of the ground conductor 190 is longer than the length L2 (length in the X axis direction) of the power supply line 170. In the example of FIG. 8, the width W1 (length in the Y axis direction) of the ground conductor 190 is the same as the width W2 (length in the Y axis direction) of the power supply line 170. That is to say, in the example of FIG. 8, the ground conductor 190 is placed in such a manner as to overlap the entire part of the power supply line 170 in the plan view of the first surface 132 of the antenna module 100B from the Z axis direction.

Note that the ground conductor 190 may have any shape provided that the ground conductor 190 is placed in such a manner as to overlap the power supply line 170. For example, the shape of the ground conductor 190 in the plan view of the first surface 132 of the antenna module 100 from the Z axis direction may be the same as the shape of the power supply line 170 in the plan view of the first surface 132 of the antenna module 100 from the Z axis direction. Further, if the coupling between the power supply line 170 and the signal line 140 and the coupling between the power supply line 170 and the antenna pattern 121 can be suppressed, the shape of the ground conductor 190 in the plan view of the first surface 132 of the antenna module 100 from the Z axis direction may be smaller than the shape of the power supply line 170 in the plan view of the first surface 132 of the antenna module 100 from the Z axis direction. Alternatively, the ground conductor 190 may be formed on the entire surface of the ground conductor layer 213.

In the present embodiment, the ground conductor 190 is provided between the power supply line 170 and the antenna pattern 121 and between the power supply line 170 and the signal line 140. Accordingly, the ground conductor 190 enables to shield radiation of a radio wave from the power supply line 170 to the antenna pattern 121 and radiation of a radio wave from the power supply line 170 to the signal line 140.

Particularly, in the antenna module 100B of the present embodiment, the value of a current flowing through the power supply line 170 increases when the thickness H3 of the power supply line 170 is made thicker. As a result, the electromagnetic field generated from the power supply line 170 becomes stronger. This facilitates the coupling between the power supply line 170 and the signal line 140 and further facilitates the coupling between the power supply line 170 and the antenna pattern 121. In the present embodiment, the ground conductor 190 is provided between the power supply line 170 and the antenna pattern 121 and between the power supply line 170 and the signal line 140. Accordingly, even if the electromagnetic field generated from the power supply line 170 becomes stronger, the ground conductor 190 can suppress the coupling between the power supply line 170 and the signal line 140 and the coupling between the power supply line 170 and the antenna pattern 121.

Further, in the Z axis direction of the antenna module 100B, the ground conductor 190 overlaps the power supply line 170 in the plan view of the first surface 132. Accordingly, the ground conductor 190 can suppress the coupling between the power supply line 170 and the signal line 140 and the coupling between the power supply line 170 and the antenna pattern 121.

Third Embodiment

Figure 9:
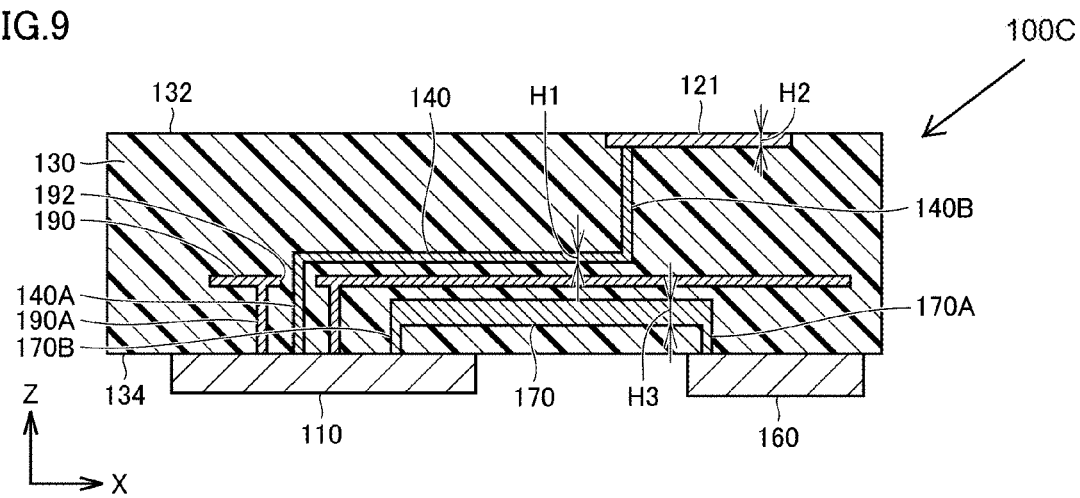
FIG. 9 is a cross-sectional view of an antenna module according to a third embodiment.

In an antenna module 100C of the third embodiment, the power supply circuit 160 is provided on the second surface 134. That is to say, in the antenna module 100C, the RFIC 110 and the power supply circuit 160 are provided on the same surface (second surface 134). FIG. 9 is a cross-sectional view of the antenna module 100C of the third embodiment.

As illustrated in FIG. 9, in the antenna module 100C, the RFIC 110 and the power supply circuit 160 are provided on the same surface (second surface 134). In the first embodiment and the second embodiment, the power supply circuit 160 is provided outside the antenna module. Compared to the first embodiment and the second embodiment, in the antenna module 100C of the present embodiment, the length L of the power supply line 170 can be shortened. Accordingly, the flexibility in designing the antenna module can be improved while reducing the transmission loss of power in the power supply line 170.

Note that FIG. 9 illustrates the example in which the ground conductor 190 is provided between the power supply line 170 and the antenna pattern 121 and between the power supply line 170 and the signal line 140. However, in the antenna module employing the configuration in which the ground conductor 190 is provided between the power supply line 170 and the second surface 134, the power supply circuit 160 may be provided on the second surface 134.

Fourth Embodiment

In the antenna modules of the first embodiment to the third embodiment, the antenna pattern 121 is exposed on the dielectric substrate 130. However, the antenna pattern 121 may alternatively be formed on a layer inside the dielectric substrate 130. That is to say, the antenna pattern 121 may be formed in such a manner as not to be exposed on the dielectric substrate 130. Forming the antenna pattern 121 on a layer inside the dielectric substrate layer 130 enables the reduction of fabrication cost in the fabrication process of the antenna module.

Figure 11:
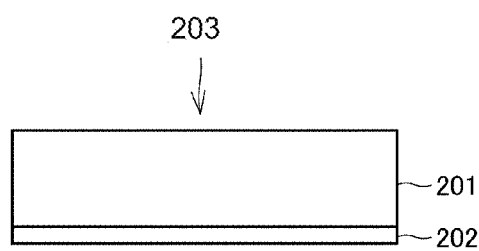
FIG. 11 is a diagram illustrating one example of a joined layer.

FIG. 11 illustrates one example of a joined layer 203 to be used for an antenna module fabrication. The joined layer 203 of FIG. 11 is configured by joining the dielectric layer 201 before vias and the like are formed thereon and the metal layer 202 before etching and the like are performed thereon.

In general, a multilayer substrate such as the dielectric substrate 130 is formed by performing etching processing on the joined layers 203 such as the one illustrated in FIG. 11 and stacking the processed joined layers 203 on top of each other.

In order to fabricate the antenna module in which the antenna pattern 121 is exposed on the dielectric substrate 130, in a process of stacking a plurality of layers, it is necessary to reverse the direction of a layer including the antenna pattern 121 in the stacking direction relative to the other layers of the plurality of layers.

Further, since the antenna pattern 121 is exposed, it is also necessary to perform resist processing and the like on the antenna pattern 121 for protecting the antenna pattern 121.

Figure 10:
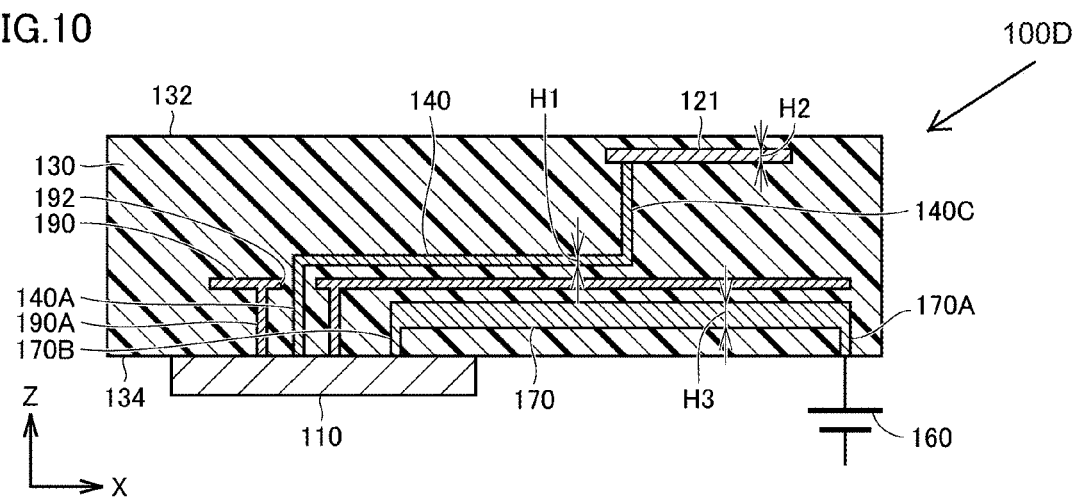
FIG. 10 is a cross-sectional view of an antenna module according to a fourth embodiment.

FIG. 10 is a cross-sectional view of an antenna module 100D of the fourth embodiment. In the antenna module 100D of the fourth embodiment, as illustrated in FIG. 10, the antenna pattern 121 is formed on a layer inside the dielectric substrate 130.

In an antenna module having the antenna pattern 121 on a layer therein, such as the antenna module 100D, there is no need to perform processing of reversing the joined layer. Further, since the antenna pattern 121 is not exposed, it is not necessary to perform the resist processing on the antenna pattern 121. Accordingly, compared with the antenna module in which the antenna pattern 121 is exposed, the antenna module 100D of the present embodiment can reduce the fabrication cost.

In the following, in FIG. 11, "the dielectric layer 201 before vias and the like are formed thereon" is referred to as "the dielectric layer 201 before processing". Further, "the metal layer 202 before etching and the like are performed thereon" is referred to as "the metal layer 202 before processing". Further, a joined layer 203 formed of the dielectric layer 201 before processing and the metal layer 202 before processing is referred to as a "joined layer 203 before processing".

FIGS. 12A, 12B, and 12C are diagrams illustrating one example of a fabrication method of the antenna module 100D. FIG. 12A is a diagram illustrating a joined layer to be used for fabrication of the antenna module 100D.

In the example of FIG. 12A, as a plurality of joined layers, five joined layers are used for fabrication of the antenna module 100D. Note that the number of the joined layers is not limited to "5", and may also be another number (for example, "6").

These five joined layers of FIG. 12A are formed by respectively performing etching processing and via-formation processing on five joined layers 203 before processing (see FIG. 11). These five joined layers are the antenna pattern layer 211, the signal line layer 212, the ground conductor layer 213, the power supply line layer 214, and the radio frequency circuit layer 215. The antenna pattern layer 211 corresponds to "first layer", the power supply line layer 214 corresponds to "second layer", and the ground conductor layer 213 corresponds to "third layer".

The antenna pattern layer 211 includes a dielectric layer 211A and the antenna pattern 121 (metal layer). The antenna pattern 121 is formed by performing etching and the like on the metal layer 202 before processing.

The signal line layer 212 includes a dielectric layer 212A and the signal line 140 (metal layer). The signal line 140 is formed by performing etching and the like on the metal layer 202 before processing. The dielectric layer 212A is configured by forming the via 140B on the dielectric layer 201 before processing.

The ground conductor layer 213 includes a dielectric layer 213A and the ground conductor 190 (metal layer). The ground conductor 190 is formed by performing etching and the like on the metal layer 202 before processing. The dielectric layer 213A is configured by forming the via 140A on the dielectric layer 201 before processing. The via 140A passes through the opening 192 formed on the ground conductor 190.

The power supply line layer 214 includes the dielectric layer 214A and the power supply line 170 (metal layer). The power supply line 170 is formed by performing etching and the like on the metal layer 202 before processing. The dielectric layer 214A is configured by forming the via 140A and the via 190A on the dielectric layer 201 before processing.

The radio frequency circuit layer 215 includes a dielectric layer 215A. The dielectric layer 215A is configured by forming the via 190A, the via 140A, the via 170A, and the via 170B on the dielectric layer 201 before processing. The dielectric layer 215A has a mounting surface 215B. The RFIC 110 is mounted on the mounting surface 215B in such a way that the RFIC 110 is electrically connected to the via 190A, the via 140A, and the via 170B with solder bumps (not particularly illustrated) interposed therebetween.

The stacking process illustrated in FIG. 12A is a process in which the plurality of joined layers (the antenna pattern layer 211, the signal line layer 212, the ground conductor layer 213, the power supply line layer 214, and the radio frequency circuit layer 215) are stacked on top of each other in such a way that the metal layers thereof are all facing the same direction. Typically, the stacking process is a process in which the plurality of joined layers is stacked in such a way that the metal layers thereof are all facing the direction (negative direction of the Z axis) to the side where the RFIC 110 is mounted. In other words, the stacking process is a process in which all the joined layers other than the radio frequency circuit layer 215 (that is, four joined layers) are stacked in such a manner as to face the mounting surface 215B side and the metal layer of the radio frequency circuit layer 215 faces the same direction as that of the metal layers of these four joined layers.

FIG. 12B is a diagram illustrating a pressure-bonding process in which the plurality of joined layers having been stacked in the stacking process is pressure-bonded. When the plurality of joined layers of FIG. 12A is pressure-bonded, a shape illustrated in FIG. 12B is obtained. The pressure-bonding is, for example, thermocompression bonding. This pressure-bonding process forms the dielectric substrate 130.

FIG. 12C is a diagram illustrating the state where the RFIC 110 is mounted on the mounting surface 215B after the plurality of joined layers are pressure-bonded. Further, in FIG. 12C, the power supply circuit 160 is connected to the via 170A.

Next, advantageous effects of the antenna module 100D of the fourth embodiment and the fabrication method of the antenna module 100D are described. According to the fabrication method of the antenna module 100D of the fourth embodiment, there is no need to reverse the up-down direction (Z-axis direction) of the antenna pattern layer 211 in the stacking process. This reduces the man-hours in the stacking process.

Further, the antenna module 100D of the fourth embodiment and the fabrication method of the antenna module 100D enable the antenna pattern 121 to be configured in such a manner as not to be exposed externally. Accordingly, there is no need to perform the resist processing on the antenna pattern layer 211. As described above, the antenna module 100D enables to reduce the fabrication cost.

Figure 13:
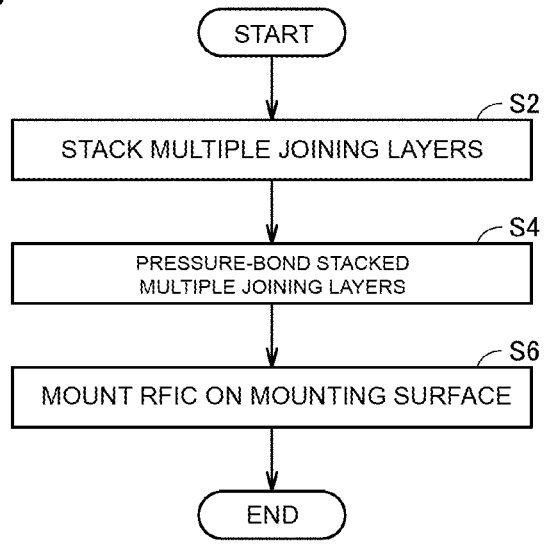
FIG. 13 is a flowchart of a fabrication method of an antenna module according to the fourth embodiment.

FIG. 13 is a flowchart of the fabrication method of the antenna module 100D. In step S2, as illustrated in FIG. 12A, a plurality of joined layers are stacked on top of each other. Next, in step S4, as illustrated in FIG. 12B, the plurality of stacked joined layers is pressure-bonded. Next, in step S6, as illustrated in FIG. 12C, the RFIC 110 is mounted on the mounting surface 215B of the pressure-bonded joined layers.

As described above, in the fourth embodiment, the antenna module 100D is fabricated by stacking the plurality of joined layers in such a way that all the metal layers thereof are facing the same direction (direction toward the mounting surface 215B) and by pressure-bonding a plurality of the stacked joined layers.

Figure 14A:
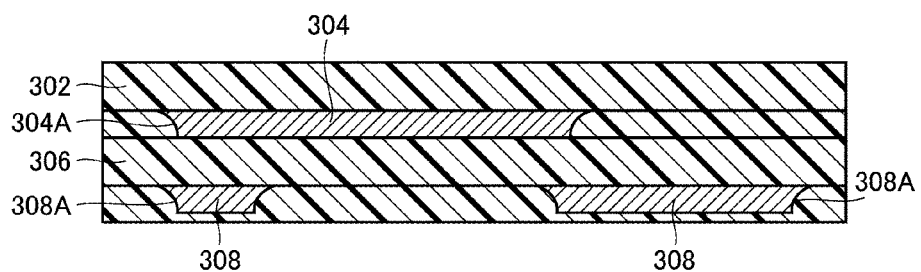
FIGS. 14A and 14B are diagrams illustrating a member formed by pressure-bonding a plurality of joined layers using a same-direction pressure bonding technique.
Figure 14B:
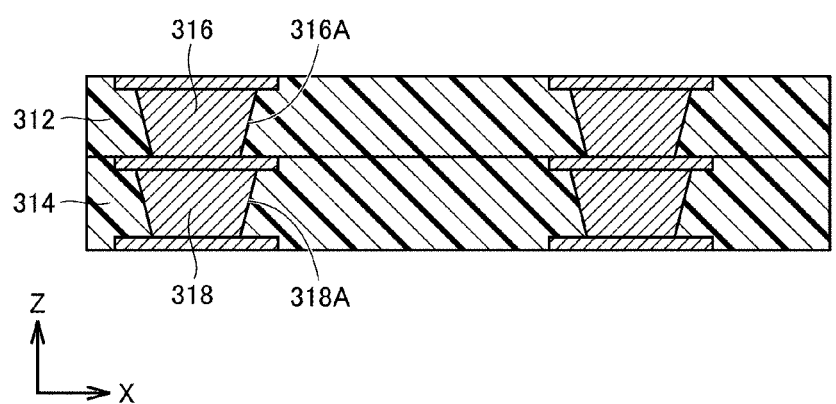

FIGS. 14A and 14B are diagrams illustrating one example of a member formed by pressure-bonding a plurality of joined layers using techniques of the present embodiment. In the example of FIG. 14A, an electrode 304 (etched metal layer or the like) is formed on a dielectric layer 302. This electrode 304 includes a tapered surface 304A.

Further, an electrode 308 (etched metal layer or the like) is formed on a dielectric layer 306. This electrode 308 includes a tapered surface 308A. Next, the dielectric layer 302 and the dielectric layer 306 are pressure-bonded together using the techniques of the present embodiment.

As illustrated in FIG. 12A, in the member fabricated by the techniques of present embodiment, directions of the tapered surface 304A and the tapered surface 308A are the same. Typically, the tapering direction caused by the tapered surface 304A and the tapering direction caused by the tapered surface 308A are the same.

In the example of FIG. 14B, a via 316 is formed on a dielectric layer 312. The via 316 includes a tapered surface 316A. Further, a via 318 is formed on a dielectric layer 314. The via 318 includes a tapered surface 318A. Next, the dielectric layer 312 and the dielectric layer 316 are pressure-bonded together using the techniques of the present embodiment.

As illustrated in FIG. 12B, in the member fabricated by the techniques of present embodiment, directions of the tapered surface 316A and the tapered surface 318A are the same. Typically, the tapering direction caused by the tapered surface 316A and the tapering direction caused by the tapered surface 318A are the same.

Modification Example

Thus far, the present disclosure is not limited to the embodiments described above. The present disclosure is not limited to the embodiments described above, and various modifications and applications may be possible.

(1) In FIG. 3 and the like, there is disclosed the configuration in which the antenna pattern 121 and the power supply line 170 overlap in the plan view from the Z axis direction. Alternatively, a configuration in which part of the antenna pattern 121 and the power supply line 170 overlap in the plan view from the Z axis direction may be employed. Further, a configuration in which the antenna pattern 121 and the power supply line 170 do not overlap in the plan view from the Z axis direction may also be employed.

(2) In FIG. 3 and the like, there is disclosed the configuration in which the RFIC 110 is mounted on the second surface 134 of the dielectric substrate 130. Alternatively, the antenna module may be configured in such a way that the antenna module includes an interposer and the RFIC 110 is mounted on the dielectric substrate 130 with the interposer interposed between the RFIC 110 and the second surface 134.

(3) In FIG. 3 and the like, it is described that the power supply line 170 is provided on a layer inside the dielectric substrate 130. Alternatively, the power supply line 170 may be provided, for example, on the lowest layer in the Z axis direction. In this case, resist processing is performed on the surface where the power supply line 170 is provided for protection of the power supply line 170.

(4) In the present embodiment, it is described that the ground conductor provided between the power supply line 170 and the signal line 140 and the ground conductor provided between the power supply line 170 and the antenna pattern 121 are the same (both are the ground conductor 190). Alternatively, the ground conductor provided between the power supply line 170 and the signal line 140 and the ground conductor provided between the power supply line 170 and the antenna pattern 121 may be formed as different ground conductors.

(5) In the present embodiment, it is described that the RFIC 110 is provided on the second surface 134. Alternatively, the RFIC 110 may be provided on the first surface 132. That is to say, the RFIC 110 may be provided on the same surface as that of the antenna pattern 121.

Figure 15:
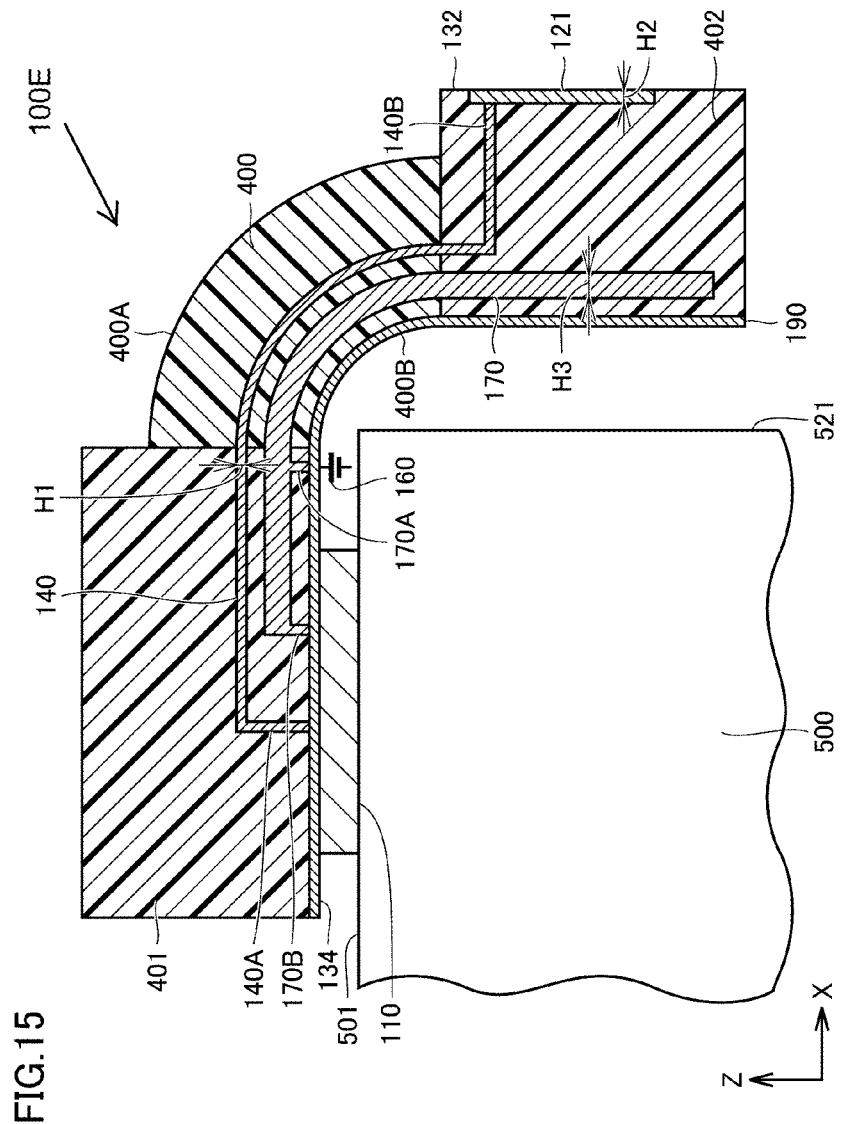
FIG. 15 is a cross-sectional view of an antenna module according to a modification example.

(6) It is described that the shape of the antenna module of the present embodiment is a flat shape. Alternatively, the shape of the antenna module may have a curved shape. FIG. 15 is a cross-sectional view of an antenna module 100E of the modification example in the X-Z plane. The antenna module 100E includes dielectric substrates 401 and 402 and a curved flexible substrate 400. The flexible substrate 400 has flexibility. The dielectric substrates 401 and 402 and the flexible substrate 400 are composed of, for example, a resin such as epoxy, polyimide, or the like. Further, the flexible substrate 400 may alternatively be formed using liquid crystal polymer having a lower dielectric constant or fluorine resin. Note that in place of the flexible substrate 400, a rigid substrate having thermo-plasticity may be provided.

The thickness of the flexible substrate 400 is thinner than thicknesses of the dielectric substrates 401 and 402, and thus the flexible substrate 400 has a structure that is easy to bend. Of the antenna module 100E, the dielectric substrate 401 is placed on a principal surface 501 of a mounting substrate 500 with the RFIC 110 interposed therebetween. The antenna pattern 121 is placed on the dielectric substrate 402 in such a manner as to radiate a radio wave to the normal direction (that is, the X axis direction of FIG. 15) of a side surface 521 of the mounting substrate 500. In the dielectric substrate 401, one end portion of the signal line 140 is connected to the RFIC 110 by way of the via 140A. The signal line 140 extends to the dielectric substrate 402 through the inside of the flexible substrate 400. In the dielectric substrate 402, the other end portion of the signal line 140 is connected to the antenna pattern 121 by way of the via 140B.

In the dielectric substrates 401 and 402, the ground conductor 190 is placed on a surface opposite the mounting substrate 500. Further, the ground conductor 190 is placed along a curved portion of the flexible substrate 400.

In the dielectric substrate 401, one end portion of the power supply line 170 is electrically connected to the RFIC 110 by way of the via 170B. In the dielectric substrate 401, the power supply line 170 is connected to the power supply circuit 160 by way of the via 170A. The power supply line 170 extends to the dielectric substrate 402 through the inside of the flexible substrate 400.

The flexible substrate 400 has an outer-side curved surface 400A and an inner-side curved surface 400B. Both the signal line 140 inside the flexible substrate 400 and the power supply line 170 inside the flexible substrate 400 are placed in a region closer to the inner-side curved surface 400B.

As illustrated in FIG. 15, the thickness of the power supply line 170 inside the dielectric substrate 401, the flexible substrate 400, and the dielectric substrate 402 is thicker than the thickness of the antenna pattern 121. Accordingly, as is the case with the first embodiment, the antenna module 100E also enables to improve the flexibility in design.

The RFIC 110 is activated when the RFIC 110 receives power from the power supply circuit 160. When the RFIC 110 is activated, heat is generated from the RFIC 110. In the antenna module 100E, the power supply line 170 from the power supply circuit 160 extends to the dielectric substrate 402 through the inside of the flexible substrate 400. The power supply line 170 is a conductive body such as copper, silver, aluminum, or the like and has a higher heat-transfer coefficient than that of the dielectric substrate. This enables to transfer the heat generated at the RFIC 110 to the dielectric substrate 402 side using the power supply line 170 inside the flexible substrate 400 and the power supply line 170 inside the dielectric substrate 402. Accordingly, the antenna module 100E enables to efficiently release the heat generated at the RFIC 110 using the power supply line 170, and as a result, cooling effect of the RFIC 110 can be increased.

In the case where a configuration is employed in which the signal line 140 inside the flexible substrate 400 is placed at a region closer to the outer-side curved surface 400A, tensile force applied to the signal line 140 increases, compared to the configuration in which the signal line 140 inside the flexible substrate 400 is placed at the region closer to the inner-side curved surface 400B. When the tensile force applied to the signal line 140 increases, the length of the signal line 140 increases and the cross-sectional area of the signal line 140 decreases. Accordingly, the change rate of impedance of the signal line 140 increases, and the deviation from a desired impedance of the signal line 140 increases. Further, when the tensile force applied to the signal line 140 increases, the possibility of breakage of the signal line 140 increases.

As illustrated in FIG. 15, in the antenna module 100E, the signal line 140 inside the flexible substrate 400 is placed in the region closer to the inner-side curved surface 400B. Accordingly, compressive force is applied to the signal line 140. Further, the signal line 140 is placed outer side of the power supply line 170, and thus the compressive force applied to the signal line 140 can be reduced, compared to a configuration in which the signal line 140 is placed inner side of the power supply line 170. Accordingly, in the case where the configuration is employed in which the signal line 140 inside the flexible substrate 400 is placed at the region closer to the inner-side curved surface 400B, the amount of deformation of the signal line 140 can be reduced, compared to the configuration in which the signal line 140 inside the flexible substrate 400 is placed at the region closer to the outer-side curved surface 400A. When the amount of deformation of the signal line 140 becomes smaller, the change rate of impedance of the signal line 140 can be suppressed. Accordingly, in the antenna module 100E, the amount of deviation from a desired impedance of the signal line 140 can be reduced. Further, in the antenna module 100E, no tensile force is applied to the signal line 140, and this enables to reduce the possibility of breakage of the signal line 140.

It is to be understood that the embodiments described in the present disclosure are exemplary in all aspects and are not restrictive. It is intended that the scope of the present disclosure is determined by the claims, not by the description of the embodiments described above, and includes all variations which come within the meaning and range of equivalency of the claims.

REFERENCE SIGNS LIST 100, 100B, 100C, 100D antenna module, 110 RFIC, 120 antenna array, 121 antenna pattern, 130 dielectric substrate, 132 first surface, 134 second surface, 140 signal line, 160 power supply circuit, 170 power supply line, 190 ground conductor, 203 joined layer, 211 antenna pattern layer, 212 signal line layer, 213 ground conductor layer, 214 power supply line layer, 215 radio frequency circuit layer, 215B mounting surface, 226 solvent, 228 resist, 400 flexible substrate.

The invention claimed is:

1. An antenna module comprising:
a dielectric substrate including a multilayer structure, the dielectric substrate having a first surface and a second surface, the second surface being opposite from the first surface;
an antenna pattern provided on or inside the first surface side of the dielectric substrate;
a radio frequency circuit provided on the dielectric substrate, the radio frequency circuit configured for supplying a radio frequency signal to the antenna pattern;
a signal line configured to transmit the radio frequency signal supplied from the radio frequency circuit to the antenna pattern, wherein the signal line includes a signal line via connected to the radio frequency circuit and extending in a stacking direction of the dielectric substrate; and
a power supply line configured to supply power to the radio frequency circuit, wherein
a thickness of the power supply line in the stacking direction is thicker than a thickness of the antenna pattern in the stacking direction, wherein the power supply line extends longitudinally within the dielectric substrate in a direction orthogonal to the stacking direction, and wherein the power supply line includes a power supply line via connected to the radio frequency circuit and extending in the stacking direction, and wherein the signal line via is arranged parallel to the power supply line via.

2. The antenna module according to claim 1, wherein a thickness of the signal line in the stacking direction is thinner than the thickness of the power supply line in the stacking direction.

3. The antenna module according to claim 2, wherein the thickness of the signal line in the stacking direction is thinner than the thickness of the antenna pattern in the stacking direction.

4. The antenna module according to claim 3, further comprising:
a ground conductor provided between the power supply line and the signal line.

5. The antenna module according to claim 3, wherein the radio frequency circuit is provided on the second surface side.

6. The antenna module according to claim 3, further comprising:
a power supply circuit provided on the second surface side, the power supply circuit supplying the power to the radio frequency circuit via the power supply line.

7. The antenna module according to claim 2, further comprising:
a ground conductor provided between the power supply line and the signal line.

8. The antenna module according to claim 7, wherein the ground conductor is provided in such a manner as to overlap the power supply line in a plan view of the antenna module.

9. The antenna module according to claim 8, wherein the radio frequency circuit is provided on the second surface side.

10. The antenna module according to claim 7, wherein the radio frequency circuit is provided on the second surface side.

11. The antenna module according to claim 7, further comprising:
a power supply circuit provided on the second surface side, the power supply circuit supplying the power to the radio frequency circuit via the power supply line.

12. The antenna module according to claim 2, wherein the radio frequency circuit is provided on the second surface side.

13. The antenna module according to claim 2, further comprising:
a power supply circuit provided on the second surface side, the power supply circuit supplying the power to the radio frequency circuit via the power supply line.

14. The antenna module according to claim 1, wherein the radio frequency circuit is provided on the second surface side.

15. The antenna module according to claim 1, further comprising:
a power supply circuit provided on the second surface side, the power supply circuit supplying the power to the radio frequency circuit via the power supply line.

16. The antenna module according to claim 1, wherein the antenna pattern is provided on a layer inside the dielectric substrate.

17. An antenna module comprising:
a dielectric substrate including a multilayer structure, the dielectric substrate having a first surface and a second surface, the second surface being opposite from the first surface;
an antenna pattern provided on or inside the first surface side of the dielectric substrate;
a radio frequency circuit provided on the dielectric substrate, the radio frequency circuit configured for supplying a radio frequency signal to the antenna pattern;
a power supply line configured to supply power to the radio frequency circuit; and
a ground conductor provided between the power supply line and the antenna pattern, wherein a thickness of the power supply line in a stacking direction of the dielectric substrate is thicker than a thickness of the antenna pattern in the stacking direction.

18. The antenna module according to claim 17, wherein the ground conductor is provided in such a manner as to overlap the power supply line in a plan view of the antenna module.

19. The antenna module according to claim 17, wherein the radio frequency circuit is provided on the second surface side.

* * * * *